United States Patent [19]

Ono et al.

[11] Patent Number: 4,738,900
[45] Date of Patent: Apr. 19, 1988

[54] THERMO-SETTING, POLYMERIZABLE COMPOSITION AND WIRING BOARD

[75] Inventors: Masahiro Ono, Hitachi; Akio Takahashi, Hitachiota; Katuo Sugawara, Hitachi; Ritsuro Tada, Mito; Akira Nagai, Hitachi; Motoyo Wajima, Hadano; Toshikazu Narahara, Ibaraki, all of Japan

[73] Assignee: Hitachi, Ltd., Tokyo, Japan

[21] Appl. No.: 854,766

[22] Filed: Apr. 23, 1986

[30] Foreign Application Priority Data

Apr. 24, 1985 [JP] Japan .................................. 60-86407

[51] Int. Cl.$^4$ .................... B32R 27/00; C08F 283/00; C08G 73/10
[52] U.S. Cl. .................................. 428/473.5; 428/131; 428/209; 428/901; 525/518; 528/322
[58] Field of Search ...................... 428/901, 473.5, 131, 428/209; 525/518; 528/322

[56] References Cited

U.S. PATENT DOCUMENTS

| | | | |
|---|---|---|---|
| 4,254,012 | 3/1981 | Green | 260/42.18 |
| 4,482,703 | 11/1984 | Takahashi et al. | 528/322 |
| 4,546,168 | 10/1985 | Takahashi et al. | 528/107 |

FOREIGN PATENT DOCUMENTS

| | | |
|---|---|---|
| 0031904 | 4/1980 | European Pat. Off. . |
| 0059434 | 2/1982 | European Pat. Off. . |
| 0078039 | 10/1982 | European Pat. Off. . |

94422 5/1985 Japan .

OTHER PUBLICATIONS

Chemical Abstracts, vol. 102, 1985, p. 37, Abstract No. 186027s, Columbus, Ohio, U.S.; & JP-A-59 196 363, (Hitachi, Ltd.), 07-11-1984.
Chemical Abstracts, vol. 103, 1985, p. 39, Abstract No. 179165c, Columbus, Ohio, U.S.; & JP-A-60 94 422, (Hitachi, Ltd.), 27-05-1985.
Chemical Abstracts, vol. 100, 1984, p. 92, Abstract No. 122903a, Columbus, Ohio, U.S.; & JP-A-58 179 229, (Hitachi, Ltd.), 20-10-1983.

Primary Examiner—Nancy A. B. Swisher
Assistant Examiner—Patrick J. Ryan
Attorney, Agent, or Firm—Antonelli, Terry & Wands

[57] ABSTRACT

Cured resin obtained by polymerization by heating of a thermo-setting, polymerizable composition comprising at least two kinds of polymerizable compounds whose exothermic polymerization temperature ranges at polymerization by heating substantially coincide with each other, for example, an aromatic maleimide compound and an aromatic cyanamide compound, the composition showing a substantially one exothermic polymerization peak at the polymerization by heating, has a good heat resistance, and a laminated, high density wiring board with a good heat resistance, capable of being directly loaded with LSI chips and chip carriers can be obtained, using the composition.

14 Claims, 4 Drawing Sheets

THERMO-SETTING, POLYMERIZABLE COMPOSITION AND WIRING BOARD

BACKGROUND OF THE INVENTION

This invention relates to a thermo-setting, polymerizable composition with a very high heat resistance after curing, and also to an organic material-based wiring board with a distinguished heat resistance, prepared from the composition.

There is a current tendency to use wiring boards of higher density in many industrial applications including computers, and consequently wiring boards with a distinguished heat resistance, which can be subjected to direct bonding with a soldering material at an elevated temperature of at least 300° C. are required for loading a large number of LSI chips and chip carriers efficiently, where the heat resistance is an important problem to be solved, because of much heat generation due to the increase in the loading density.

Among the conventional wiring boards based on organic polymers, those based on aminobismaleimide-based polymer as disclosed in, for example, Japanese Patent Publication No. 47-42160 are most distinguished in the heat resistance, but their heat resistance are still unsatisfactory for the said industrial applications, and also for bonding with a metal for electro-conductive circuits.

To solve the problem, it is disclosed in Japanese Patent Publication No. 58-27665 to use a ceramic material having a distinguished heat resistance such as alumina, etc. as an insulating layer on the said wiring board on which LSI chips and chip carriers are directly loaded. However, the wiring board has a higher dielectric constant than that of the organic material, for example, 7-9, and thus has a limit in the signal propagation speed. Furthermore, the ceramic material has a dimensional shrinkage of 15-20% at the firing and thus has problems of locational discrepancy between the layers at the lamination, etc.

On the other hand, it is known that polymers having an isomelamine ring, obtained by reaction of a dicyanamide compound with a polymerizable compound of at least divalency, for example, a polyvalent imide having an unsaturated bond, a polyfunctional epoxy compound, an organic carboxylic acid having at least divalency, or its anhydride, has a good heat resistance [Japanese Patent Application Kokai (Laid-open) No. 58-79017].

As a result of further extensive studies of optimal conditions for producing the polymers having an isomelamine ring, that is, combinations, mixing ratio, physico-chemical characteristics of the starting compounds, the present inventors have found an effective thermo-setting, polymerizable composition for a wiring board and its insulating layer, which can be subjected to direct bonding of a large number of LSI chips, etc., and has a good bonding characteristic to an electroconductive circuit and an insulating layer, and a good heat resistance. The present invention is based on such finding.

SUMMARY OF THE INVENTION

An object of the present invention is to provide a thermo-setting, polymerizable composition with a very good heat resistance after curing and a good bonding characteristic which comprises at least two kinds of polymerizable compounds whose exothermic polymerization temperature ranges at polymerization by heating substantially coincide with each other, wherein the composition preferably shows a substantially one exothermic polymerization peak at the polymerization by heating.

Another object of the present invention is to provide a wiring board with a good heat resistance, capable of loading LSI chips and chip carriers directly, which comprises an insulating resin layer reinforced by a fibrous substrate and a wiring conductor layer, the resin layer being formed by curing the said thermosetting, polymerizable composition.

Generally, in the polymerization to be carried out in a molten state, the polymerization system loses its flowability rapidly, as the polymerization reaction proceeds. Particularly in a three-dimensional cross-linking polymerization such as in curing of molding or laminating materials, this tendency is more pronounced. In other words, a temperature range and time suitable for successfully carrying out polymerization of curable, high melting point compounds by heating are very limited.

The present inventors have presumed that in the polymerization by heating it is very desirable for obtaining a thermo-set resin having a good uniformity in quality and good characteristics that heat-setting, polymerizable compounds as components of polymer materials have such properties as to start to undergo polymerization and end the polymerization within temperature ranges similar to one another.

On the basis of this presumption, the present inventors have prepared compositions from typical cross-linking polymerization-type compounds, i.e. N,N'-(methylene-di-p-phenylene)bismaleimide, abbreviated hereinafter as "BMI", and bis(3-methyl-4-cyanamidophenyl)methane, abbreviated hereinafter as "BMCA", in various mixing ratios, and conducted a differential thermal analysis (DTA) of single components and their compositions at a constant temperature-elevating rate of 5° C./min and a thermogravimetric analysis (TG) of cured resins of single components and their compositions, showing their heat stabilities.

DTA and TG of BMI and BMCA alone behave as curves shown in FIG. 2, and the exothermic polymerization temperature ranges of BMI and BMCA start around 180°-190° C. and 215° C., respectively and the exothermic peaks of BMI and BMCA are both at 228° C. Their exothermic polymerization temperature ranges substantially coincide with each other on the temperature abscissa, i.e. X abscissa, though the shapes of the curves are different from each other.

Compositions containing BMI and BMCA in various mixing ratios give DTA curves shown in FIG. 3, where numerical ratios are ratios of BMI:BMCA by weight, and also give relationship between 5% weight reduction temperature of cured resins by TG and mixing ratio shown in FIG. 4.

As shown in FIG. 3, the exothermic polymerization temperature ranges of the compositions shift towards the lower temperature side as the melting points lower. In the compositions containing BMCA in relatively high mixing ratios, the heat generation takes place at two stages, and it seems that the heat generation on the lower temperature side is due to polymerization of the BMI-BMCA mixture and that on the higher temperature side is due to polymerization of BMCA in excess over the compatible limit of BMI-BMCA. These two-stage exothermic mixtures have a tendency to produce cured resin with an uneven quality.

As is obvious from FIG. 4, the thermal stability has no additive property with respect to composition ratio, but shows a convex curve, and the thermal stability of cured resins of two-stage exothermic compositions shown in FIG. 3 are lower than that of cured single BMCA resin, whereas the thermal stability of cured resins of compositions having substantially coincided exothermic polymerization temperature ranges is better. In FIG. 4, the cured resin of single BMI has a good thermal stability, but actually is quite brittle and thus is not practically used.

These DTA test results are based on the constant temperature-elevating rate of 5° C./min., and the tendency to produce cured resin of uneven quality from the compositions containing BMCA in relatively high ratios can be reduced considerably by selecting a curing temperature or by conducting preliminary polymerization in a solvent.

As described above, the present thermo-setting, polymerizable composition comprises at least two polymerizable compounds whose exothermic polymerization temperature ranges, when heated at a differential thermal analysis, substantially coincide with each other, where the composition preferably shows a substantially one exothermic polymerization peak. The differential thermal analysis may be a differential scanning calorific analysis (DSC), and may be referred to as heating at a constant temperature-elevating rate.

According to one useful embodiment of the present invention, the present thermo-setting, polymerizable composition comprises one of the polymerizable compound being at least one of compounds represented by the following general formula (I):

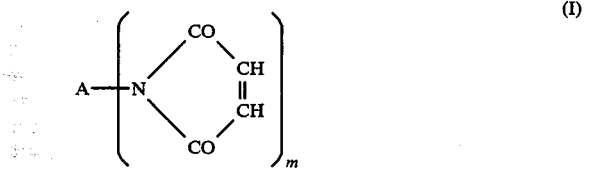

wherein A is a m-valent organic group having at least one aromatic ring, and m is an integer of 1 to 6, and the other polymerizable compound being at least one of compounds represented by the following general formula (II):

wherein B is an n-valent organic group having at least one aromatic ring, and n is an integer of 1 to 6.

The present composition can be polymerized by heating to produce a cured resin with reticular bonding of maleimide rings, isomelamine rings and melamine rings as skeletons. The cured resin has a high glass transition temperature (Tg) of at least 200° C., a high strength at an elevated temperature and a high heat stability. Furthermore, the present composition can be bonded to an electroconductive metal foil satisfactorily by lamination with the foil in a preliminary polymerization state and successive curing, and thus can be suitably applied to the production of wiring boards.

The polymerizable compounds for use in the present invention are solid at room temperature.

The polymerizable compounds represented by the general formula (I) for use in the present invention includes, for example, N,N'-methylenebismaleimide, N,N'-ethylenebismaleimide, N,N'-hexamethylenebismaleimide, N,N'-trimethylenebismaleimide, N,N'-m-phenylenebismaleimide, N,N'-p-phenylenebismaleimide, N,N'-(methylene-di-p-phenylene)bismaleimide, N,N'-(oxy-di-p-phenylene)bismaleimide, N,N'-methylenebis(3-chloro-p-phenylene)bismaleimide, N,N'-(sulfonyl-di-p-phenylene)bismaleimide, N,N'-(methylene-di-4,1-hexylene)bismaleimide, N,N'-α,α'-4,4'-dimethylenecylohexanebismalemide, N,N'-m-xylylenebismaleimide, N,N'-4,4'-diphenylcyclohexanebismaleimide, a condensate of aniline with formaldehyde, and a polyvalent maleimide represented by the following general formula:

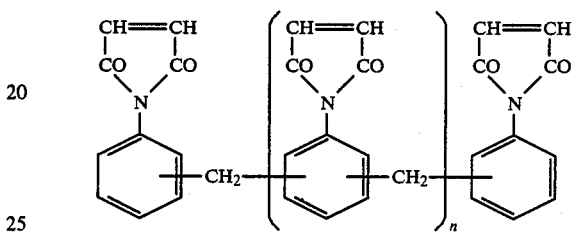

wherein n is an integer of 1 to 3, and can be used alone or in a mixture of at least two thereof.

In the present invention, the flowability of the present composition can be enhanced when a monomaleimide compound is used together. The monomaleimide compound for use in the present invention includes, for example, N-methylmaleimide, N-ethylmaleimide, N-propylmaleimide, N-butylmaleimide, N-allylmaleimide, N-vinylmaleimide, N-phenylmaleimide, N-3-chlorophenylmaleimide, N-o-tolylmaleimide, N-m-methoxyphenylmaleimide, N-p-methoxyphenylmaleimide, N-benzylmaleimide, N-pyridylmaleimide, N-hydroxyphenylmaleimide, N-acetoxyphenylmaleimide, N-dichlorophenylmaleimide, N-benzophenonemaleimide, N-diphenylethermaleimide, N-acetylphenylmaleimide, and N-cyclohexylmaleimide, and can be used alone, or in a mixture of at least two thereof.

The polymerizable compound represented by the general formula (II) for use in the present invention includes, for example, 4,4'-dicyanamidodicyclohexylmethane, 1,4-dicyanamidocyclohexane, 2,6-dicyanamidopyridine, m-phenylenedicyanamide, p-phenylenedicyanamide, 4,4'-dicyanamidodiphenylmethane, 2,2'-bis(4-cyanamidophenyl) propane, 4,4'-dicyanomidodiphenylsulfone, bis(4-cyanamidephenyl)phosphine oxide, bis(4-aminophenyl)phenylphosphine oxide, bis(4-cyanamidophenyl)methylamine, bis(4-cyanamidophenyl)methylamine, 1,5-dicyanamidonaphthalene, m-xylylenedicyanamide, 1,1-bis(p-cyanamidophenyl) furan, p-xylylenedicyanamide, hexamethylenecyanamide, 6,6'-dicyanamide-2,2'-dipyridyl, 4,4'-dicyanamidobenzophenone, 4,4'-dicyanomidoazobenzene, bis(4-cyanamidophenyl)phenylmethane, 1,1-bis(4-cyanamidophenyl)cyclohexane, 1,1-bis(4-cyanamido-3-methylphenyl)1,3,4-oxadiazole, 4,4'-dicyanamidodiphenyl ether, 4,4'-bis(p-cyanamidophenyl)-2,2'-dithiazole, m-bis(4-p-cyanamidophenyl-2-thiazolyl)benzene, 4,4'-dicyanamidobenzanilide, 4,4'-dicyanomidophenyl benzoate, 2,2'-bis[4-(4-cyanamidophenoxy)phenyl]propane, 2,2-bis[3-propyl-4-(4-cyanamidophenoxy)phenyl]propane, 2,2-bis[3-isopropyl-4-(4-cyanamidophenoxy)phenyl]propane, bis[4-(4-cyanamidophenoxy)phenyl]methane, 3,3'-methyl-4,4'-dicyanamidodiphenylmethane, 3,3'-methyl-4,4'dicyanamidodiphenyl ether, 3,3'-methyl-4,4'-dicyanamidodiphenylsulfone, 3,3'-ethyl-4,4'-dicyanamidodiphenylmethane, 3,3'-ethyl-4,4'-dicyanamidodiphenyl ether, 3,3'-ethyl-4,4'-dicyanamidodiphenylsulfone, and cyanamido-terminating sulfone ether oligomers having the following formula:

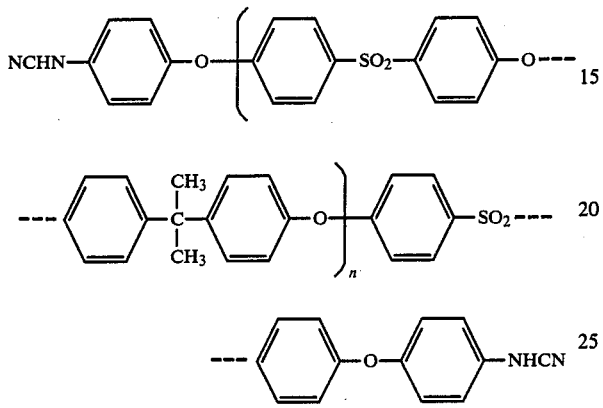

, wherein n is an integer of 0 to 3, and can be used alone, or in a mixture of at least two thereof.

A mixing ratio of the maleimide compound to the cyanamide compound in the present composition can be varied in a considerably broad range without any adverse effect on the heat resistance of cured resin, and is generally in 5:95 to 95:5 by weight, preferably 40:60 to 95:5 by weight.

When the present thermo-setting, polymerizable composition is to be used for preparing a wiring board, it can be used, as such, in a solution or varnish in an organic solvent, or as a liquid polymer or prepolymer by reaction by heating. In the latter case, the present composition is heated to about 50° to about 150° C. to bring about the so called "B" stage. The organic solvent includes, for example, methylethylketone, methylacetylketone, 2-methoxyethanol, 2-(methoxymethoxy) ethanol, 2-isopropoxyethanol, 2-(ethoxyethoxy)ethanol, dioxane, dimethyldioxane, monopropyleneglycol methyl ether, N,N-dimethylformamide, and N-methyl-2-pyrrolidone, and can be used alone, or in a mixture of at least two thereof. Particularly preferable are methylethylketone, 2-methoxyethanol, N,N-dimethylformamide, N-methyl-2-pyrrolidone, and dioxane. The organic solvent is contained in an amount of 20 to 70% by weight on the basis of total solution or varnish.

Reinforcing materials such as inorganic or organic fibers are impregnated with the solution or varnish, or the polymer or prepolymer solution, and then the organic solvent is removed therefrom by drying. The drying temperature depends on the boiling point of the organic solvent used, and preferably is about 100° to about 170° C. The inorganic or organic fibers for use in the present invention are, for example, at least one of carbon fibers, rock fibers, slug fibers, glass fibers, quartz fibers, ceramic fibers, tungsten fibers, beryllium fibers, polyamide-based fibers, aramide fibers, etc.

Then, a necessary number of the thus prepared prepreg sheets are laid one upon another, and copper foils are laid each at the upper and the lower end of the stacked sheets, and subjected to lamination bonding at a lamination-bonding condition of 150° to 300° C. for 5 to 600 minutes, preferably at 170° to 260° C. for 30 to 200 minutes.

Then, a resist is baked on the copper surface, and a circuit is formed by etching to provide a wiring board.

Then, the thus prepared wiring boards are subjected to lamination bonding through prepregs, whereby a multi-layer structure can be readily obtained. The same lamination-bonding condition as above can be used. To connect the respective layers, through-holes are provided and subjected to copper plating, and finally an outer layer circuit is finished to provide a multilayered wiring board.

PREFERRED EMBODIMENTS OF THE INVENTION

Example 1

| | |
|---|---|
| N,N'—(methylene-di-p-phenylene)-bismaleimide (BMI) | 70 parts by weight |
| Bis(3-methyl-4-cyanamidophenyl)-methane (BMCA) | 30 parts by weight |

Figure 1:
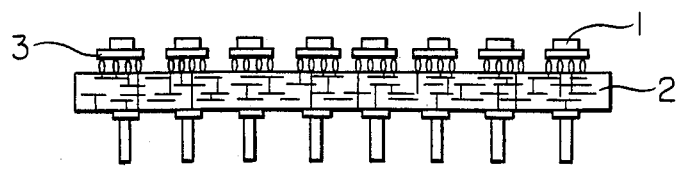
FIG. 1 is a schematic cross-sectional view of actually loaded, high density, multi-layered circuit board according to one embodiment of the present invention.
Figure 3:
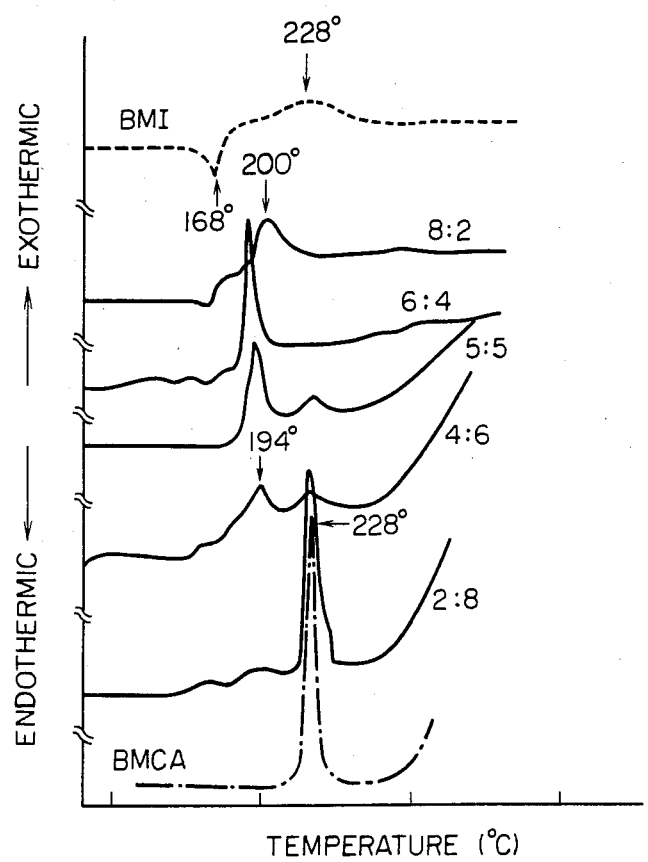
FIG. 3 is a diagram showing DTA curves of compositions in various composition ratios.
Figure 2:
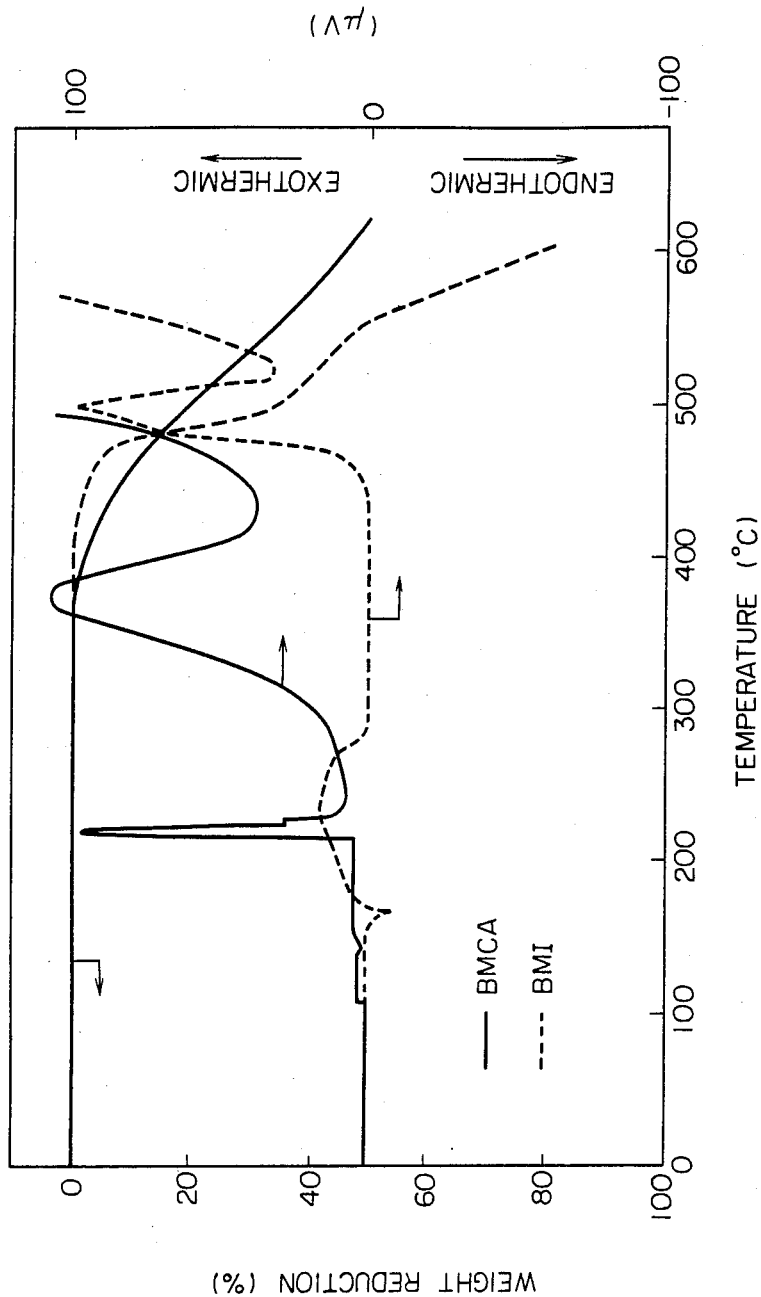
FIG. 2 is a diagram showing a differential thermal analysis (DTA) and a thermogravimetric analysis (TG) of typical compounds used in the present thermosetting, polymerizable compounds.
Figure 4:
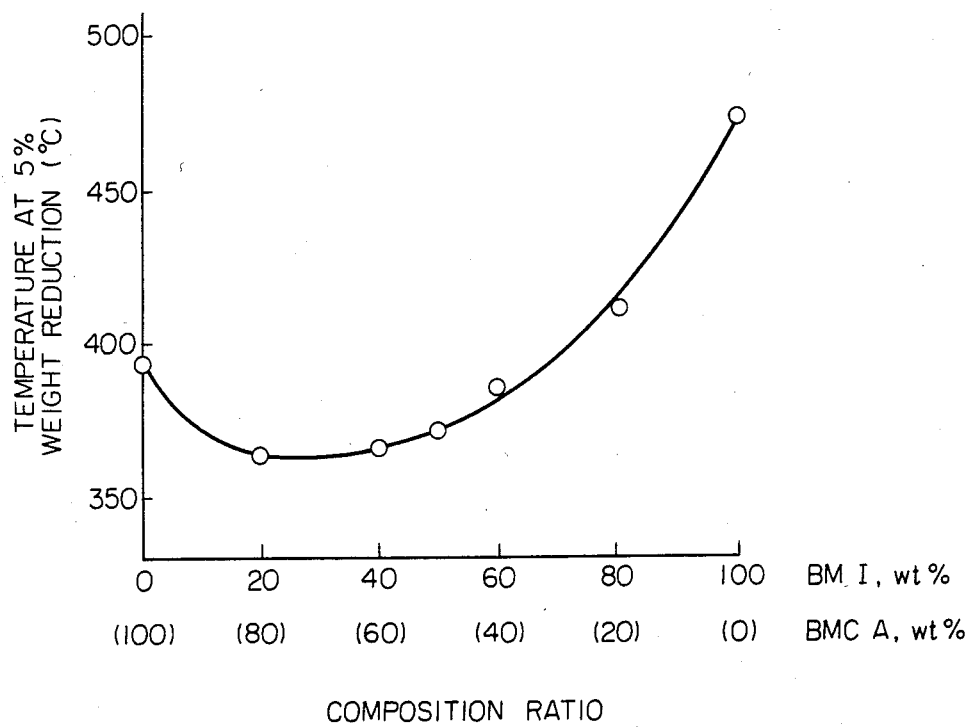
FIG. 4 is a diagram showing relationship between the composition ratio and the heat stability of cured resin.

The foregoing two compounds were subjected to reaction at 130° C. for 30 minutes in 100 parts by weight of N,N'-dimethylformamide as a solvent to obtain a varnish containing prepolymers. Then, the varnish was applied onto a glass plate, and the solvent was removed therefrom by drying, and the glass plate was heated at 220° C. for 120 minutes to obtain a cured resin. The cured resin thus obtained could be applied to an actually loaded device in a form of a high density, multi-layered wiring board shown in FIG. 1, because BMI and BMCA had substantially coincided exothermic polymerization temperature ranges at the polymerization by heating as shown in FIG. 2. In FIG. 1, numeral 1 is cooling fins, 2 is a multi-layered wiring board, and 3 LSI chips.

Example 2

E-glass fibers were impregnated with the varnish containing prepolymers used in Example 1, and the solvent was removed therefrom by drying at 160° C. to obtain a prepreg. 10 sheets of the prepregs obtained in this manner were laid one upon another, and copper foils were placed each on the upper and lower end of the stacked prepregs and subjected to heat bonding at 220° C. for 120 minutes. Then, holes, 1 mm in diameter, were provided on the resulting laminate board, and subjected to copper plating, and finally a circuit was formed thereon by etching to obtain a wiring board.

Example 3

A wiring board was prepared in the same manner as in Example 2 except that quartz glass fibers were used in place of the glass fibers.

Example 4

A wiring board was prepared in the same manner as in Example 2, except that aramide fibers were used in place of the glass fibers.

Comparative Example 1

Prepolymers were obtained by subjecting 100 parts by weight of aminobismaleimide to prelimary polymerization at 120° C. for 30 minutes in 100 parts by weight of N,N'-dimethylformamide as a solvent. The thus obtained prepolymers were applied to a glass plate, and the solvent was removed therefrom by drying at 160° C. Then, the glass plate was heated at 220° C. for 120 minutes to obtain a cured resin.

Comparative Example 2

Quartz glass fibers were impregnated with the prepolymers prepared in Comparative Example 1, and the solvent was removed therefrom by drying at 160° C. to obtain a prepreg. A wiring board was formed in the same manner as in Example 1, using the prepregs prepared in this manner.

Figure 5:
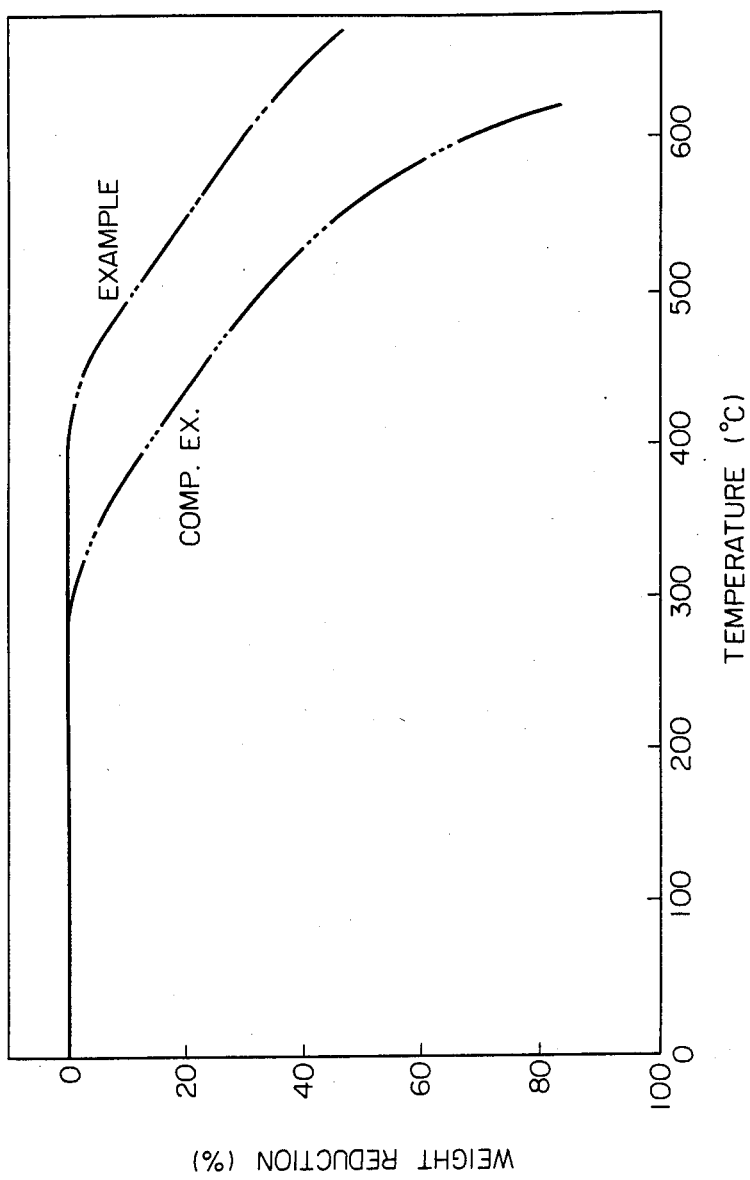
FIG. 5 is a diagram showing TG curves of the present cured resin and the conventional resin.

In the following Table, characteristics of wiring boards prepared in Examples 2, 3, 4 and Comparative Example 2 are shown. In FIG. 2, DTA and TG curves (temperature-elevating rate: 5° C./min) of the starting compounds used in Example 1 and Comparative Example 1 are shown, and in FIG. 5, the thermal decomposition characteristics (TG curves) of cured resins obtained in Example 1 and Comparative Example 1 are shown.

TABLE

| Characteristics | | Example 2 | Example 3 | Example 4 | Comparative Example 2 |
|---|---|---|---|---|---|
| Glass transition temperature | (°C.) | 340 | 340 | 340 | 190 |
| Bending strength (%)[1] | 100° C. | 95 | 96 | 93 | 92 |
| | 150° C. | 92 | 94 | 90 | 84 |
| | 180° C. | 88 | 90 | 87 | 78 |
| | 220° C. | 85 | 88 | 83 | 63 |
| Solder heat resistance (min.)[2] | 300° C. | 10≦ | 10≦ | 10≦ | 5 |
| | 350° C. | 10≦ | 10≦ | 10≦ | 0.2≧ |
| Heat cycles at chip carrier loading[3] | | 200> | 800< | 800< | Failure to bond |
| Peel strength (kgf/m$^2$)[4] | | 1.8 | 1.8 | 1.8 | 0.6 |

Remarks:
[1] According to JIS C6481-1976.
[2] According to JIS C6481-1976.
[3] Cycle number until chip carriers are peeled off at heat cycles between −55° and 150° C.
[4] According to JIS C6481-1976, using a 70 μm-thick copper foil.

As is obvious from the glass transition temperature and solder heat resistance in the foregoing Table, the present wiring boards had a very good heat resistance, and also an anti-heat cycle characteristic when chip carriers were loaded, that is, a low thermal expansion coefficient. Furthermore, as is obvious from the peel strength, the present wiring boards had a good bonding.

As is also obvious from FIG. 2, the present starting compounds generate heat at polymerization by heating, and had substantially coincided exothermic polymerization temperature ranges with an exothermic polymerization temperature difference of not more than 50° C., and underwent copolymerization. Furthermore, as is obvious from FIG. 5, the cured resins obtained from the present composition by polymerization by heating showed no weight reduction by decomposition up to a temperature as high as 350° C., and thus had a good heat stability.

According to the present invention, a laminated, high density wiring board with a good heat resistance, capable of being directly loaded with LSI chips and chip carriers can be obtained, using the present composition.

What is claimed is:

1. A wiring board which comprises an insulating resin layer comprising a plurality of prepeg sheets laid one upon another, and a wiring conductor layer provided on the insulating resin layer; the prepeg sheets each being formed by curing a thermo-setting, polymerizable composition comprising at least two kinds of polymerizable compounds whose exothermic temperature ranges at polymerization by heating substantially coincide with each other, reinforced by a fibrous reinforcing material; one of said polymerizable compounds being at least one of aromatic malemide compounds and the other polymerizable compound being at least one of aromatic cyanamide compounds.

2. A wiring board according to claim 1, wherein the polymerizable compounds are solids at room temperature, and have a difference of not more than 50° C. in exothermic polymerization-starting temperature therebetween, and the composition shows a substantially one exothermic polymerization peak at polymerization by heating.

3. A wiring board according to claim 1, wherein the aromatic maleimide compound is N,N'-(methylene-di-p-phenylene)bismaleimide, and the aromatic cyanamide compound is bis(3-methyl-4-cyanamidophenyl)methane.

4. A wiring board according to claim 1, wherein the fibrous substrate is inorganic or organic fibers.

5. A wiring board according to claim 4, wherein the inorganic or organic fibers are at least one of carbon fibers, rock fibers, slug fibers, glass fibers, quartz fibers, ceramic fibers, tungsten fibers, beryllium fibers, polyamide-based fibers, and aramide fibers.

6. A wiring board according to claim 1, wherein one of the polymerizable compounds is at least one of the compounds represented by the following general formula (I):

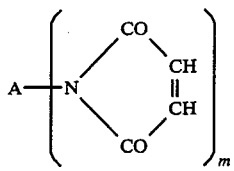

$$\left\{ A \overline{\phantom{x}} N \begin{array}{c} CO \\ \diagdown \\ \diagup \\ CO \end{array} \begin{array}{c} CH \\ \| \\ CH \end{array} \right\}_m \quad (I)$$

wherein A is a m-valent organic group having at least one aromatic ring, and m is an integer of 1 to 6, and the other polymerizable compound is at least one of compounds represented by the following general formula (II):

B—(NHCN)$_n$ (II)

wherein B is an n-valent organic group having at least one aromatic ring, and n is an integer of 1 to 6.

7. A wiring board according to claim 1, wherein the aromatic maleimide compounds are N,N'-methylenebismaleimide, N,N'-ethylenebismaleimide, N,N'-hexamethylenebismaleimide, N,N'-trimethylenebismaleimide, N,N'-m-phenylenebismaleimide, N,N'-p-phenylenebismaleimide, N,N'-(methylene-di-p-phenylene)bismaleimide, N,N'-(oxy-di-p-phenylene)bismaleimide, N,N'-methylenebis(3-chloro-p-phenylene)bismaleimide, N,N'-(sulfonyl-di-p-phenylene)bismaleimide, N,N'-(methylene-di-4,1-hexylene)bismaleimide, N,N'-α,α'-4,4'-dimethylenecyclohexanebismaleimide, N,N'-m-xylylenebismaleimide, N,N'-4,4'-diphenylcyclohexanebismaleimide, a condensate of aniline with formaldehyde, and a polyvalent maleimide represented by the following general formula:

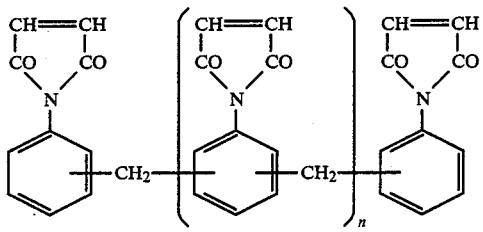

wherein n is an integer of 1 to 3, and the aromatic cyanamide compounds are 4,4'-dicyanamidodicyclohexylmethane, 1,4-dicyanamidocyclohexane, 2,6'-dicyanamidopyridine, m-phenylenedicyanamide, p-phenylenedicyanamide, 4,4'-dicyanamidodiphenylmethane, 2,2'-bis(4-cyanamidophenyl)propane, 4,4'-dicyanamidodiphenylsulfone, bis(4-cyanamidophenyl)phosphine oxide, bis(4-aminophenyl)phenylphosphine oxide, bis(4-cyanamidophenyl)methylamine, bis(4-cyanamidophenyl)methylamine, 1,5-dicyanamidonaphthalene, m-xylylenedicyanamide, 1,1-bis(p-cyanamidophenyl)furan, p-xylylenedicyanamide, hexamethylenedicyanamide, 6,6'-dicyanamido-2,2'-dipyridyl, 4,4'-dicyanamidobenzophenone, 4,4'-dicyanamidoazobenzene, bis(4-cyanamidophenyl)phenylmethane, 1,1-bis(4-cyanamidophenyl)cyclohexane, 1,1-bis(4-cyanamido-3-methylphenyl)-1,3,4-oxadiazole, 4,4'-dicyanamidodiphenyl ether, 4,4'-bis(p-cyanamidophenyl)-2,2'-dithiazole, m-bis(4-p-cyanamidophenyl-2-thiazolyl)benzene, 4,4'-dicyanamidobenzanilide, 4,4'-dicyanamidodiphenyl benzoate, 2,2'-bis[4-(4-cyanamidophenoxy)phenyl]propane, 2,2-bis[4-propyl-4-(4-cyanamidophenoxy)phenyl]propane, 2,2'-bis[3-isopropyl-4-(4-cyanamidophenoxy)phenyl]propane, bis[4-(4-cyanamidophenoxy)phenyl]methane, 3,3'-methyl-4,4'-dicyanamidodiphenylmethane, 3,3'-methyl-4,4'-dicyanamidodiphenyl ether, 3,3'-methyl-4,4'-dicyanamidodiphenylsulfone, 3,3'-ethyl-4,4'-dicyanamidodiphenylmethane, 3,3'-ethyl-4,4'-dicyanamidodiphenyl ether, 3,3'-ethyl4,4'-dicyanamidodiphenylsulfone, and cyanamido-terminating sulfone ether oligomers having the following formula:

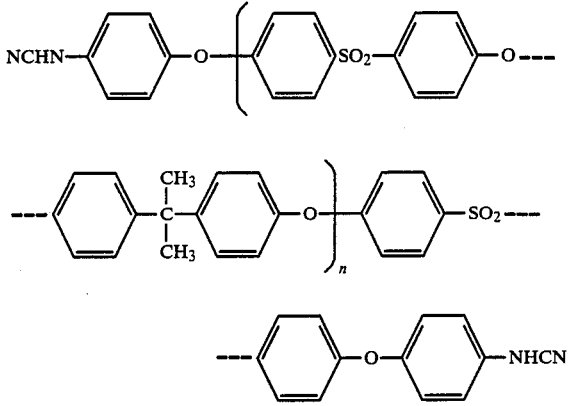

wherein n is an integer of 0 to 3.

8. A wiring board according to claim 1, wherein the aromatic maleimide compound is N,N'-(methylene-di-p-phenylene)bismaleimide and the aromatic cyanamide is bis(3-methyl-4-cyanamidophenyl)methane.

9. A wiring board according to claim 1, wherein a mixing ratio of the aromatic maleimide compound to the aromatic cyanamide compound is 5:95 to 95:5 by weight.

10. A wiring board according to claim 1, wherein at least one of monomaleimide compounds is contained.

11. A wiring board according to claim 2, wherein the thermo-setting, polymerizable composition is in a form of a solution or varnish in an organic solvent.

12. A wiring board according to claim 11, wherein the organic solvent is at least one of methylethylketone, methylacetylketone, 2-methoxyethanol, 2-(methoxymethoxy)ethanol, 2-isopropoxyethanol, 2-(ethoxyethoxy)ethanol, dioxane, dimethyldioxane, monopropyleneglycol methyl ether, N,N-dimethylformamide, and N-methyl-2-pyrrolidone.

13. A wiring board according to claim 11, wherein the organic solvent is at least one of methylethylketone, 2-methoxyethanol, N,N-dimethylformamide, N-methyl-2-pyrrolidone, and dioxane.

14. A wiring board according to claim 11, wherein the organic solvent is contained in an amount of 20 to 70% by weight on the basis of total solution or varnish.